(12) United States Patent
Liu et al.

(10) Patent No.: US 7,903,428 B2
(45) Date of Patent: Mar. 8, 2011

(54) INTRA-CONNECTION LAYOUT OF ARRAY

(75) Inventors: Shou-En Liu, Taichung (TW); Chen-Pang Kung, Taoyuan County (TW); Wei-Hsin Hou, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 432 days.

(21) Appl. No.: 12/110,364

(22) Filed: Apr. 28, 2008

(65) Prior Publication Data
US 2009/0279271 A1 Nov. 12, 2009

(30) Foreign Application Priority Data
Nov. 27, 2007 (TW) .............................. 96144985 A

(51) Int. Cl.
*H05K 7/00* (2006.01)
(52) U.S. Cl. ....................................... 361/777; 174/260
(58) Field of Classification Search .................. 361/760, 361/777; 174/250–265; 438/106, 612, 34; 257/686, 369
See application file for complete search history.

(56) References Cited

U.S. PATENT DOCUMENTS

| | | | | |
|---|---|---|---|---|
| 2004/0251504 A1* | 12/2004 | Noda | ............................. | 257/369 |
| 2005/0048695 A1* | 3/2005 | Chia et al. | ..................... | 438/106 |
| 2006/0160261 A1* | 7/2006 | Sheats et al. | .................... | 438/34 |
| 2007/0001280 A1* | 1/2007 | Hua | ............................. | 257/686 |
| 2009/0191665 A1* | 7/2009 | Nikitin et al. | ................. | 438/107 |
| 2009/0273097 A1* | 11/2009 | Hedler | .......................... | 257/778 |

* cited by examiner

*Primary Examiner* — Yuriy Semenenko
(74) *Attorney, Agent, or Firm* — Jianq Chyun IP Office

(57) ABSTRACT

An intra-connection layout of array is disclosed. An alterable area is disposed between the devices of a device array. The alterable area includes an insulation layer, a plurality of first conductive wires and a plurality of second conductive wires. The first conductive wires are disposed within the alterable area along a first direction for selectively connecting electrical paths in the first direction between different devices. The second conductive wires are disposed within the alterable area along a second direction for selectively connecting electrical paths in the second direction between different devices. The insulation layer is disposed within the alterable area and between the above-mentioned first conductive wires and second conductive wires, wherein the insulation layer has an opening to allow one of the first conductive wires and one of the second conductive wires to be contacted with each other.

22 Claims, 8 Drawing Sheets

INTRA-CONNECTION LAYOUT OF ARRAY

CROSS-REFERENCE TO RELATED APPLICATION

This application claims the priority benefit of Taiwan application serial no. 96144985, filed on Nov. 27, 2007. The entirety of the above-mentioned patent application is hereby incorporated by reference herein and made a part of specification.

BACKGROUND OF THE INVENTION

1. Field of the Invention

The present invention generally relates to a layout of connection, and more particularly, to an intra-connection layout of array.

2. Description of Related Art

Due to the low cost, the process feature under a normal temperature and the advantages, printing technology (for example, screen printing or inkjet printing) has been deeply developed and broadly applied to fabricate flexible circuit boards (FCBs) or flexible electronic devices today. However, during implementing a circuit by using the printing technology, an unstable situation often occurs at a turning region of a printed path, which easily results in a failure. In addition, the design of paths is a much time consuming job. For example, during implementing conductive wires on a FCB by using inkjet printing process, an ink-bleeding problem often occurs at the turning regions of an inkjet printed path. Furthermore, during implementing a long metal wire by using an inkjet printing process, a problem of broken line or ink-lacking would likely occur on the path of the long metal wire.

FIG. 1 is a conventional intra-connection layout of array implemented by using inkjet printing process. A transistor array containing devices 111, 112, 113 and 114 is shown in FIG. 1, wherein the device 111 includes a transistor 115, the gate of the transistor 115 is connected to a bonding pad 116 through an intra-connection implemented by using a non-inkjet printing, and the drain and the source of the transistor 115 are respectively connected to the bonding pads 117 and 118 through two intra-connections implemented by using a non-inkjet printing. The bonding pad 119 herein is out of duty for reservation. Similar to the device 111, the remaining devices 112, 113 and 114 are implemented but they are being omitted for simplicity.

The gate of the device 111 is electrically connected to the gate of the device 114 through an inkjet printed path, the source of the device 111 is electrically connected to the drain of the device 113 through an inkjet printed path and the drain of the device 111 is electrically connected to the source of the device 112 through an inkjet printed path. The source of the device 114 is electrically connected to the gates of the devices 112 and 113 through two inkjet printed paths. In the transistor array, the printed pattern at turning regions of an inkjet printed path by using the inkjet printing technology is unstable and may result in short-circuit between adjacent metal wires, and the design of paths is difficult and hard to be automated. In addition, if an inkjet printed path is too long, the impedance of the inkjet printed path may be excessive, and the broken line or ink-lacking problem may occur, which changes the specified wire width and make the quality control difficult.

SUMMARY OF THE INVENTION

Accordingly, the present invention is related to an intra-connection layout of array, which includes a device array and at least an alterable area. The device array comprises a plurality of devices. The alterable area is disposed between the above-mentioned devices. The alterable area includes a plurality of first conductive wires, a plurality of second conductive wires and an insulation layer. The first conductive wires are disposed within the alterable area along a first direction by the printing process for selectively connecting the wiring paths in the first direction between the above-mentioned devices. The second conductive wires are disposed within the alterable area along a second direction by printing process for selectively connecting the wiring paths in the second direction between the above-mentioned devices. The insulation layer is disposed within the alterable area and between the above-mentioned first conductive wires and second conductive wires, wherein when one of the first conductive wires and one of the second conductive wires are electrically connected to each other, an opening is disposed at a corresponding position of the insulation layer so as to electrically connected first conductive wire with the second conductive wire.

The present invention is also related to an intra-connection layout of array, which includes a device array, a plurality of electrical paths in the first direction, a plurality of electrical paths in the second direction and at least an alterable area. The device array comprises a plurality of devices. Each of the electrical paths in the first direction is disposed in a first direction space between the above-mentioned devices along the first direction by a non-inkjet-printing; each of the electrical paths in the second direction is disposed in a second direction space between the above-mentioned devices along the second direction by a non-inkjet-printing. The alterable area is disposed between the above-mentioned devices. The alterable area includes a plurality of first conductive wires, a plurality of second conductive wires and an insulation layer. The first conductive wires are disposed within the alterable area along a first direction and respectively connect the electrical paths in the first direction. The second conductive wires are disposed within the alterable area along a second direction and respectively connect the electrical paths in the second direction. The insulation layer is disposed within the alterable area and between the first conductive wires and second conductive wires, wherein when one of the first conductive wires and one of the second conductive wires are electrically connected to each other, an opening is disposed at a corresponding position of the insulation layer so as to allow the first conductive wire and the second conductive wire to be connected with each other.

The layout of the present invention can selectively dispose an opening in the insulation layer depending on the design requirement so as to allow the first conductive wires and the second conductive wires along different directions to be electrically connected with each other.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
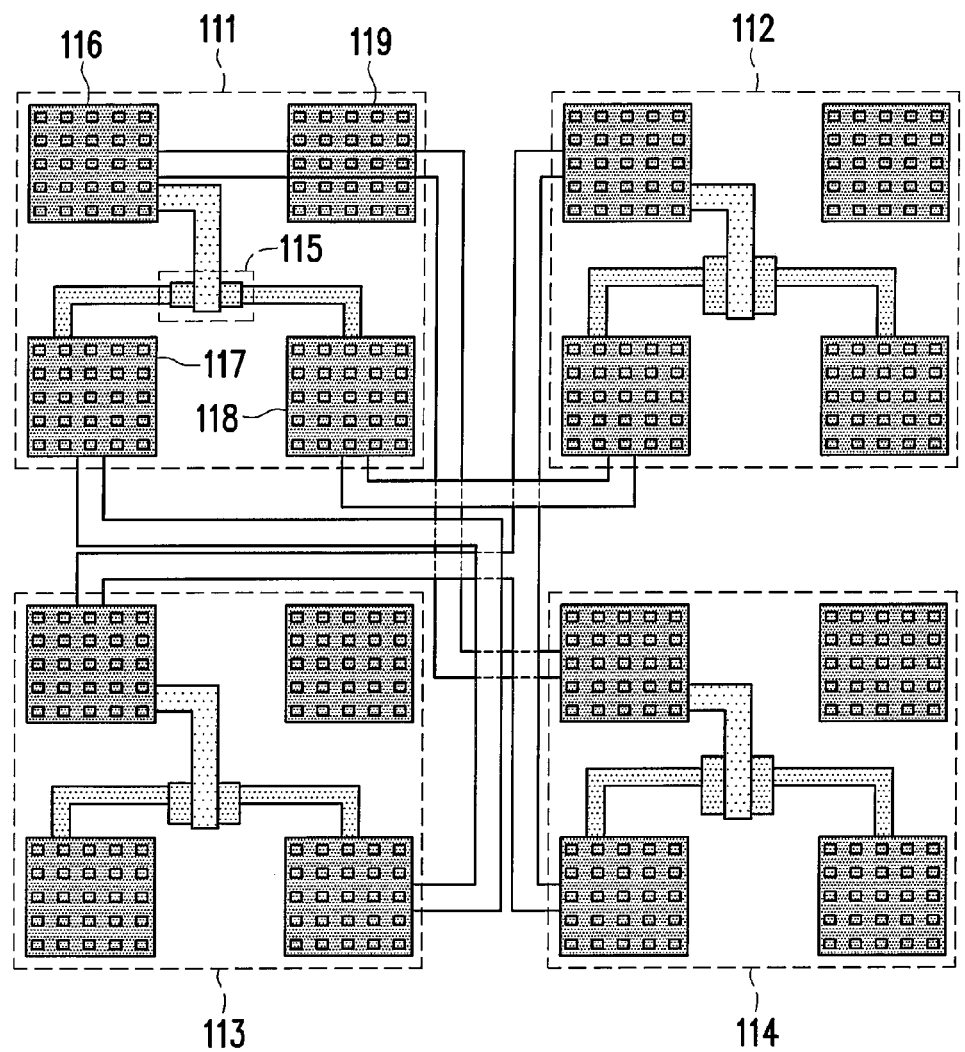
FIG. 1 is a conventional intra-connection layout of array implemented by using inkjet printing process.

Reference will now be made in detail to the present embodiments of the invention, examples of which are illustrated in the accompanying drawings. Wherever possible, the same reference numbers are used in the drawings and the description to refer to the same or like parts.

When an intra-connection layout of array is implemented by using printing (for example, screen printing or inkjet printing), the pattern formed at a turning region of a printed path is often likely to be unstable causing a short-circuit between the pattern and the adjacent conductive wires. For example, when a conductive wire is implemented by inkjet printing on a FCB, ink-bleeding often occurs at the turning region of the printed path. Besides, a too long inkjet printed path has excessive impedance in addition to the broken line or ink-lacking problem occurring sometime, which unexpectedly changes the specified wire width of the inkjet printed path to make the defects uncontrollable.

Figure 2:
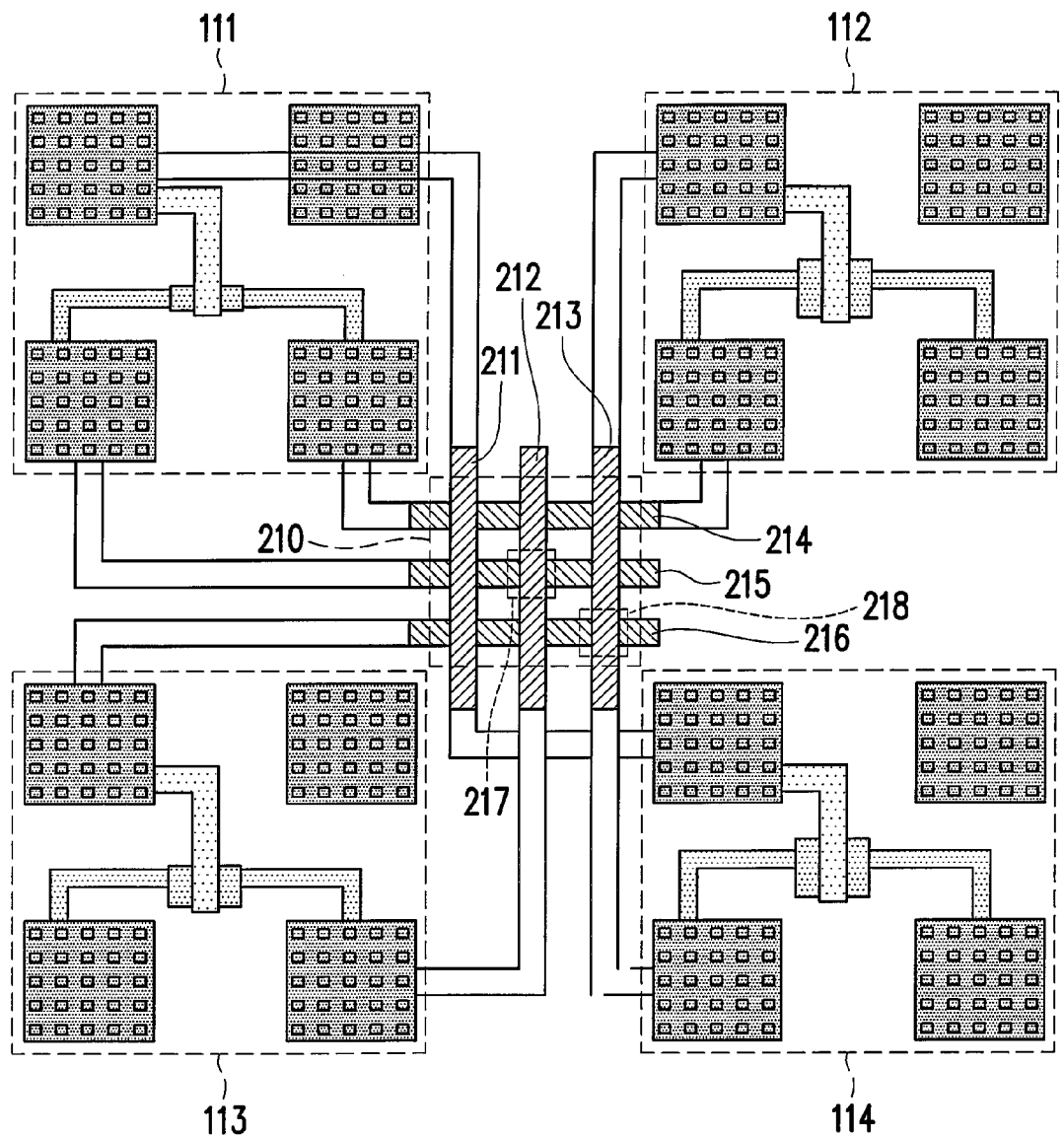
FIG. 2 is an intra-connection layout of array according to an embodiment of the present invention.

The device array can be a transistor array or an array composed of other devices. The device array can be implemented on a FCB to form a specific flexible device. Certainly, the printing technology can be applied to devices of other types in addition to the flexible device. In a device array, an alterable area is disposed at the turning regions of intra-connections of array between each of the devices. For the purpose of illustration, the inkjet printing exemplarily is taken as an example to describe the present invention hereinafter, and the alterable area of the present invention is exemplarily disposed at the busy-running region of the inkjet printed paths (central portion) in FIG. 1. The embodiment is shown by FIG. 2. For simplicity, other turning regions of other array intra-connections in FIG. 2 are omitted.

FIG. 2 is an intra-connection layout of array according to an embodiment of the present invention. Referring to FIG. 2, the layout includes a device array and at least an alterable area. The device array has a plurality of devices (herein only devices 111, 112, 113 and 114 are exemplarily shown). The alterable area 210 is disposed between the devices 111-114, and the bonding pads of the devices 111-114 are respectively connected to the pins of the alterable area 210, the above-mentioned uncontrollable situation caused by inkjet printing one of the regions can be avoided.

Figure 3:
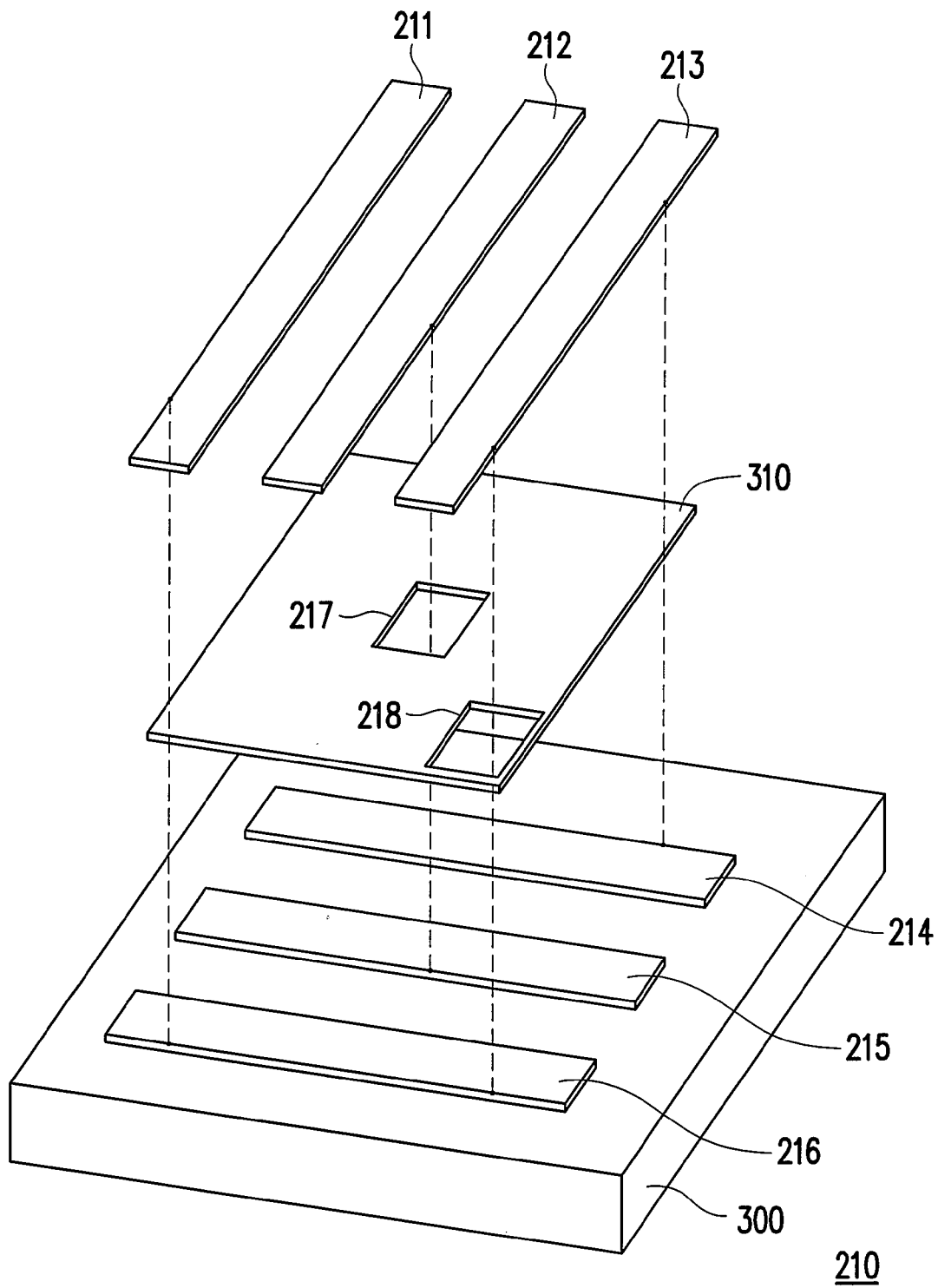
FIG. 3 is an exploded diagram of an alterable area in FIG. 2 according to the present invention.

FIG. 3 is an exploded diagram of an alterable area 210 shown in FIG. 2 according to the present invention. Referring to FIGS. 2 and 3, the alterable area 210 includes a plurality of first conductive wires (only 211, 212 and 213 are shown), a plurality of second conductive wires (only 214, 215 and 216 are shown) and an insulation layer 310. In the embodiment, the first conductive wires 211-213 are disposed in the alterable area 210 by inkjet printing along a first direction (a longitudinal direction or a vertical direction) for selectively connecting the electrical paths in the first direction between the devices 111 and 112 and between the devices 113 and 114; and the second conductive wires 214-216 are disposed in the alterable area 210 by inkjet printing along a second direction (a traverse direction or a horizontal direction) for selectively connecting the electrical paths in the second direction between the devices 111 and 113 and between the devices 112 and 114.

Although the above-mentioned conductive wires 211-216 are implemented by using inkjet printing, but the present invention is not limit thereto as such. For example, the conductive wires 211-216 can be formed by using screen printing, metal press bounding or metal depositing. In another embodiment, the conductive wires 214-216 at the lower layer are formed by a process different from the process for forming the conductive wires 211-213 at the upper layer; for example, the conductive wires 214-216 at the lower layer are formed by using screen printing, but the conductive wires 211-213 at the upper layer are formed by using inkjet printing.

The insulation layer 310 is disposed within the alterable area 210 and between the first conductive wires 211-213 and the second conductive wires 214-216, wherein when one of the first conductive wires 211-213 and one of the second conductive wires 214-216 are electrically connected to each other, an opening is disposed at a corresponding position of the insulation layer 310 so as to allow the first conductive wire and the second conductive wire to contact with each other. For example, to electrically connect the first conductive wire 212 to the second conductive wire 215 (to form an equivalent structure imitating the turning region of intra-connection), an opening 217 is disposed at the corresponding position of the insulation layer 310 so as to allow the first conductive wire 212 to electrically connect with the second conductive wire 215. Similarly, the insulation layer 310 comprises an opening 218 so as to allow the first conductive wire 213 to electrically connect with the second conductive wire 216 and also to electrically connect the source of the device 114 to the gates of the devices 112 and 113 through intra-connections of the array.

The embodiment can automatically implement the intra-connection layout of array by using a computer. The automated printing (exemplarily taking inkjet printing) process may be described as follows. First, the number of the conductive wires in the first direction and the conductive wires in the second direction passing through the alterable area 210 are calculated. For example, the number of conductive wires in the first direction and the conductive wires in the second direction respectively include three wires. The number of the conductive wires in the first direction and the conductive wires in the second direction depend on the number of the conductive wires surrounding the alterable area 210, as shown in FIG. 2. In other embodiments, the maximum number of the conductive wires in the first direction and the conductive wires in the second direction are specified according to the design rule of a circuit board (considering the minimum wire width and the minimum interval between adjacent wires) without considering the number of the conductive wires surrounding the alterable area 210.

Next, a computer program may be employed to extract the turning regions of the paths passing through the alterable area 210 according to a mark operated by a designer, and the local area of the insulation layer 310 at the turning region (the intersection of the conductive wires in the first direction and the conductive wires in the second direction) may be removed. For example, the local area of the insulation layer 310 is removed to form openings 217 and 218. In association with an appropriate program design, the local area of the insulation layer 310 removed would not be covered by the insulation material in the step of inkjet printing the insulation layer 310. Although the insulation layer 310 is formed by using inkjet printing in the embodiment, but the insulation layer 310 may also be formed by using other processes (for example, screen printing).

In the embodiment of the present invention shown in FIG. 3, first, the second conductive wires 214-216 are disposed on the substrate 300 along the second direction and within the alterable area 210 by using inkjet printing. Next, an insulation layer 310 is disposed on the substrate 300 and the second conductive wires 214-216 by using inkjet printing. Next, first conductive wires 211-213 are disposed on the substrate 300 and the insulation layer 310 by using inkjet printing. The alterable area 210 may be implemented by using other methods. For example, the second conductive wires 214-216 may be disposed on the insulation layer 310, and the first conductive wires 211-213 may be disposed under the insulation layer 310.

Thereafter, the bonding pad of each device is connected to the corresponding pin (the end of the corresponding conductive wire) of the alterable area 210 through an electrical path in the first direction and/or an electrical path in the second direction according to the computer program, wherein the electrical paths in the first direction and the electrical paths in the second direction between the devices may be formed by using printing process, such as inkjet printing or screen printing. In another embodiment, the electrical paths in the first direction and the electrical paths in the second direction between the devices can be formed by using the process similar or identical to that used for forming intra-connections of the devices 111-114.

By using an appropriate program design to implement the above-mentioned embodiment, the short-circuit problem between adjacent metal wires at a region where connection lines are complexly disposed in the device array may be effectively avoided; and the program design may also be able to automate the connecting process, which is beneficial for mass production of flexible electronic circuits. In the layout of the embodiment, an opening can be selectively disposed in the insulation layer 310 depending on the circuit design so as to selectively allow the first and second conductive wires in different directions to electrically connect with each other and avoid a printed path from turning its way, which contributes to solve the unstable inkjet printing at a turning region of a printed path, and thereby simplify the complexity of paths and achieve the benefit the mass production of inkjet printing products (for example, flexible circuit board/flexible device).

Figure 4:
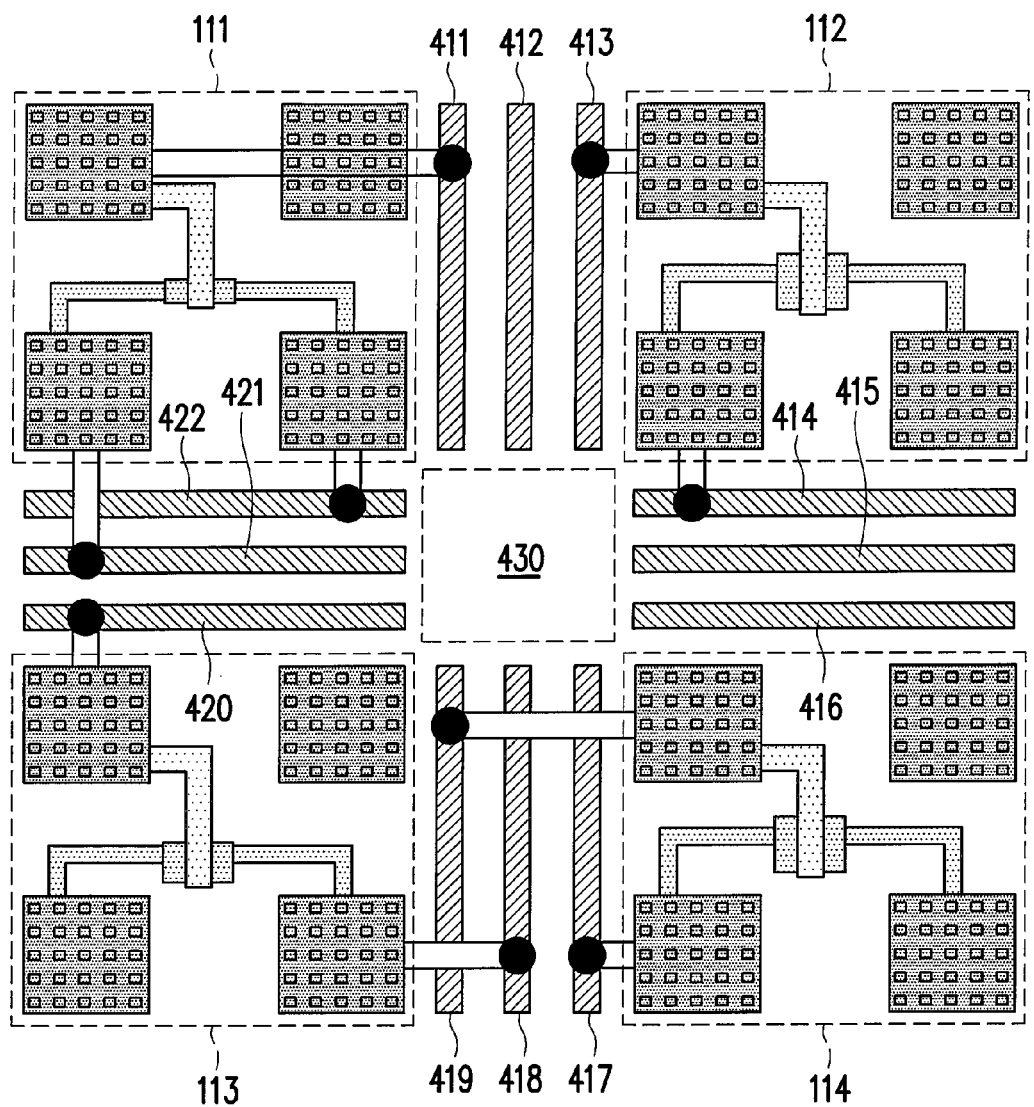
FIG. 4 is an intra-connection layout of array according to another embodiment of the present invention.

FIG. 4 is an intra-connection layout of array according to another embodiment of the present invention. As shown in FIG. 4, the layout includes a device array (for example, a transistor array, and the devices are referenced by numerals 111, 112, 113 and 114), a plurality of electrical paths (411, 412, 413, 417, 418 and 419) in the first direction, a plurality of conductive wires (414, 415, 416, 420, 421 and 422) in the second direction and an alterable area 430. The conductive wires 411-413 in the first direction are disposed in the first direction space between the devices 111 and 112 along the first direction by using a non-inkjet printing, and the conductive wires 417-419 in the first direction are disposed in the first direction space between the devices 113 and 114 along the first direction by using a non-inkjet printing; the conductive wires 414-416 in the second direction are disposed in the second direction space between the devices 112 and 114 along the second direction by using a non-inkjet printing, and the conductive wires 420-422 in the second direction are disposed in the second direction space between the devices 111 and 113 along the second direction by using a non-inkjet printing.

The above-mentioned non-inkjet printing can be a screen printing. In the embodiment, the electrical paths 411-413 and 417 and 419 in the first direction and the electrical paths 414-416 and 420-422 in the second direction are formed by using the same process as that for the intra-connections of the devices 111-114. In other words, during the formation of the devices 111-114, the electrical paths 411-413 and 417 and 419 in the first direction and the electrical paths 414-416 and 420-422 in the second direction are also simultaneously formed. In addition, the number of the electrical paths in the first direction and the electrical paths in the second direction depend on the number of the bonding pads of each device. In other embodiments, the maximum number of the conductive wires in the first direction and the conductive wires in the second direction are specified according to the design rule of a circuit board (considering the minimum wire width and the minimum interval between adjacent wires) without considering the number of bonding pads of each device.

Next, the conductive wires between each device and the corresponding electrical path in the first direction are disposed and the conductive wires between each device and the corresponding electrical path in the second direction are disposed according to the circuit design. In the embodiment, each of the above-mentioned conductive wires is formed by using inkjet printing. For example, by inkjet printing each conductive wire, the electrical path 411 in the first direction is connected to the gate bonding pad of the device 111, and another inkjet printed conductive wire is connected to the gate bonding pad of the device 114 and the electrical path 419 in the first direction. Prior to describing the implementation of the alterable area 430, the implementations of the electrical paths are introduced herein: prior to inkjet printing, the embodiment implements the electrical paths in the first direction and the electrical paths in the second direction respectively in the first direction space and the second direction space by using non-inkjet printing in advance. Since the connections in the partial arrays are implemented by using a process with a lower resistance (lower than that of inkjet printing), therefore, it can avoid a long inkjet printing path (i.e. avoid an excessive resistance), reduce the probabilities of broken line or ink-lacking events and promote the product reliability.

Figure 5:
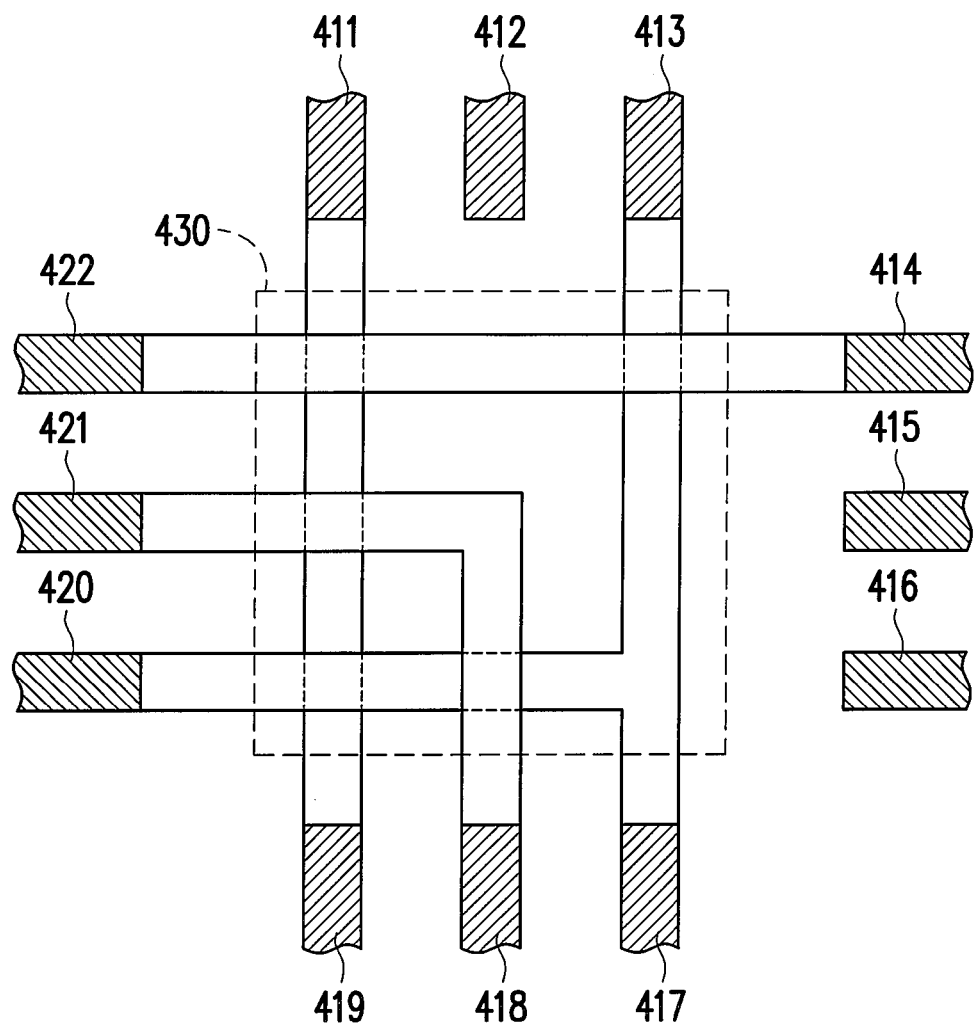
FIG. 5 is a diagram of an alterable area in FIG. 4 according to an embodiment of the present invention.

FIG. 5 is a diagram of an alterable area 430 shown in FIG. 4 according to an embodiment of the present invention. In the embodiment, the alterable area 430 is disposed by conductive wires of different patterns by using printing so as to connect the electrical paths in the first direction and the electrical paths in the second direction surrounding the alterable area 430. For example, T-shape conductive wires are formed by using inkjet printing to connect the electrical paths 413, 417 and 420 to each other; and L-shape conductive wires are formed by using inkjet printing to connect the electrical paths 418 and 421 to each other, as shown in FIG. 5.

Figure 6:
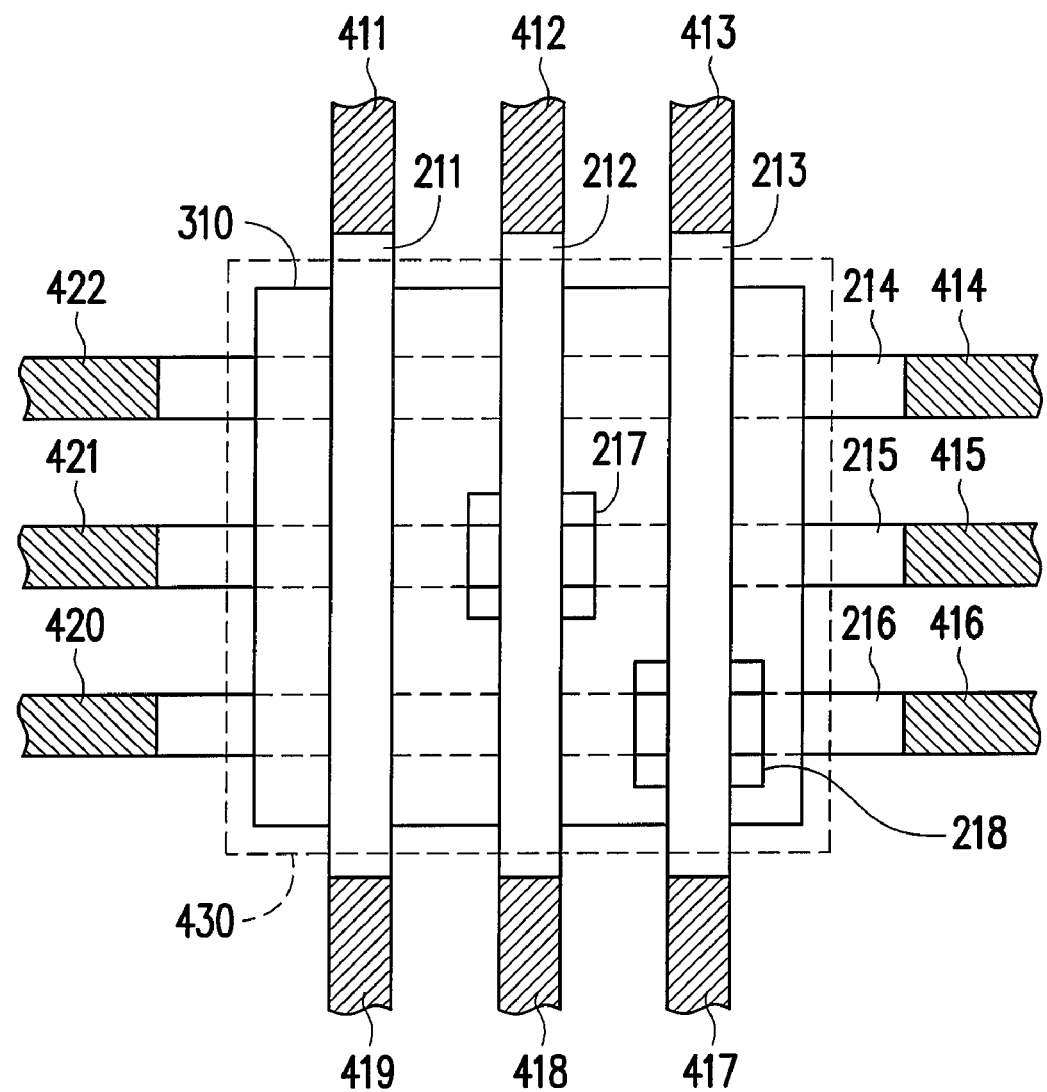
FIG. 6 is a diagram of an alterable area in FIG. 4 according to another embodiment of the present invention.

FIG. 6 is a diagram of an alterable area in FIG. 4 according to another embodiment of the present invention. In the embodiment, the alterable area 430 can be implemented by using a same process as that of the alterable area 210 shown in FIGS. 2 and 3. The alterable area 430 herein can include a plurality of first conductive wires (herein only three conductive wires 211, 212 and 213 are shown), a plurality of second conductive wires (herein only three conductive wires 214, 215 and 216 are shown) and an insulation layer 310. Both ends of the conductive wire 211 are respectively connected to the electrical paths in the first direction 411 and 419; both ends of the conductive wire 212 are respectively connected to the electrical paths 412 and 418 in the first direction; both ends of the conductive wire 213 are respectively connected to the electrical paths 413 and 417 in the first direction; both ends of the conductive wire 214 are respectively connected to the electrical paths 414 and 422 in the second direction; both ends of the conductive wire 215 are respectively connected to the electrical paths 415 and 421 in the second direction; both ends of the conductive wire 216 are respectively connected to the electrical paths 416 and 420 in the second direction. The other content of the alterable area 430 is similar to that of the alterable area 210 in FIGS. 2 and 3 and are not described herein for simplicity.

Although the above-mentioned conductive wires 211-216 of the embodiment are implemented by using inkjet printing, but the present invention is not limited thereto as such. For example, the conductive wires 211-216 can be formed by using screen printing, metal press bounding or metal depositing. In another embodiment, the conductive wires 214-216 at the lower layer are formed by the process same as that used for forming the electrical paths 414-416 and 420-422 in the second direction; the conductive wires 211-213 at the upper layer are formed by using printing (for example, inkjet printing). That is to say, during formation of the electrical paths 414-416 and 420-422 in the second direction, the conductive wires 214-216 at the lower layer are also simultaneously formed.

In addition, in consideration of layout flexibility and the impedance of the inkjet printed conductive wire, it is preferred to use a process with a lower resistance (for example, the same process as that used to form the electrical paths 411-422) to form a plurality of metal bumps, and the metal bumps are disposed at the intersections of the conductive wires 211-213 at the upper layer and the conductive wires 214-216 at the lower layer prior to disposing the conductive wires 214-216 at the lower layer. Therefore, even though inkjet printing is used to form the conductive wires 211-216 in FIG. 6, the impedance of the inkjet printed conductive wire can also be reduced by disposing the metal bumps on the substrate in advance.

Figure 7:
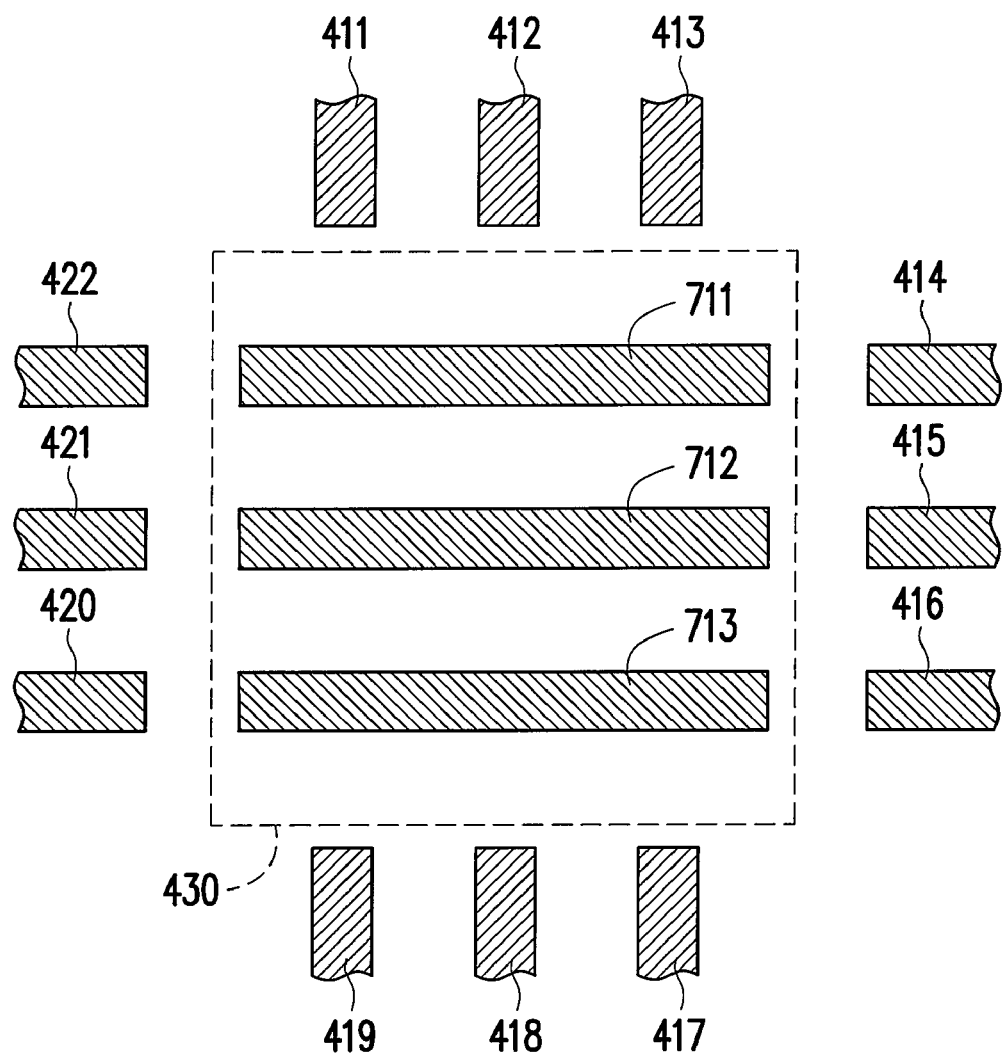
FIG. 7 is a layout diagram of the alterable area in FIG. 6 with metal bumps disposed in advance according to an embodiment of the present invention.

FIG. 7 is a layout diagram of the alterable area 430 shown in FIG. 6 with metal bumps disposed in advance according to an embodiment of the present invention. Prior to forming the conductive wires 211-213, the insulation layer 310 and the conductive wires 214-216, metal bumps 711, 712 and 713 are formed on the substrate in advance. The metal bumps 711-713 herein are disposed within the alterable area 430 and on the substrate and located at the intersections of the first conductive wires 211-213 and second conductive wires 214-216 to be formed. After forming the metal bumps 711-713, the second conductive wires 214-216 are formed. In the embodiment, the metal bumps 711-713 are formed by using the same process as that used for the electrical paths in the second direction 414-416 and 420-422. That is to say, during the formation of the electrical paths 414-416 and 420-422 in the second direction, the metal bumps 711-713 are also simultaneously formed.

Figure 8:
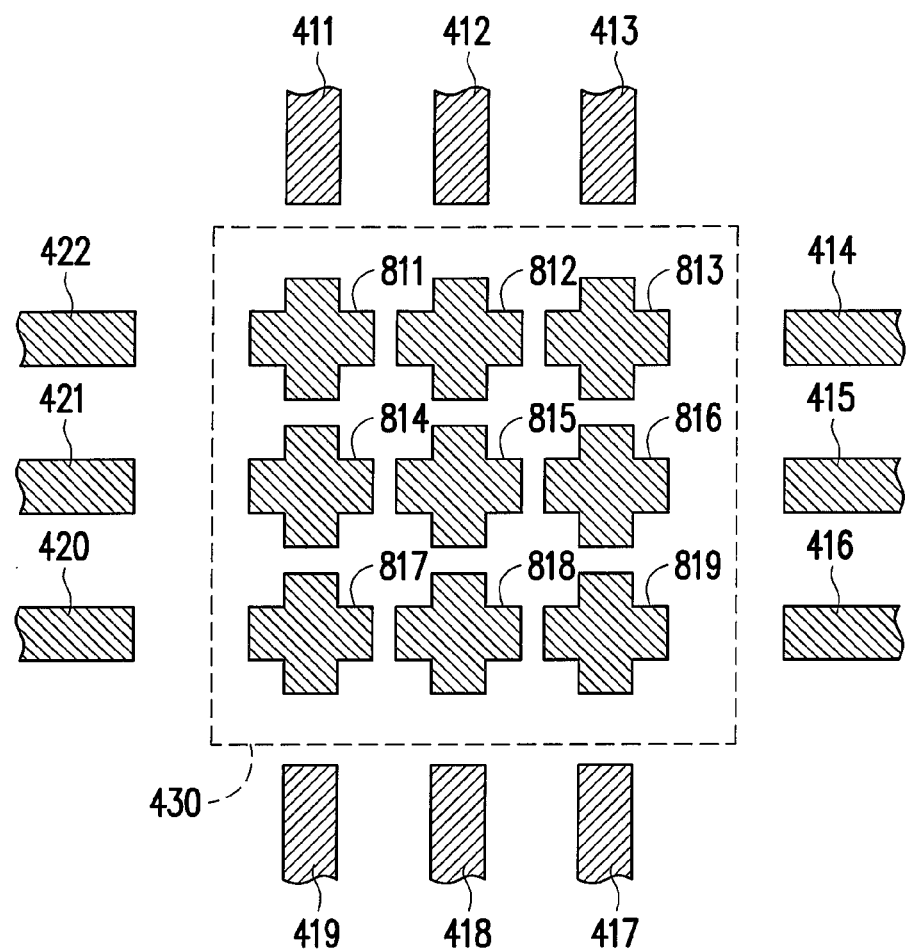
FIG. 8 is a layout diagram of the alterable area in FIG. 6 with metal bumps disposed in advance according to another embodiment of the present invention.

FIG. 8 is a layout diagram of the alterable area 430 shown in FIG. 6 with metal bumps disposed in advance according to another embodiment of the present invention. Prior to forming the conductive wires 211-213, the insulation layer 310 and the conductive wires 214-216, cross-shape metal bumps 811, 812, 813, 814, 815, 816, 817, 818 and 819 are formed on the substrate in advance. The metal bumps 811-819 herein are disposed within the alterable area 430 and on the substrate and located at the intersections of the first conductive wires 211-213 and second conductive wires 214-216 to be formed. After forming the metal bumps 811-819, the second conductive wires 214-216 are formed. In the embodiment, the metal bumps 811-819 are formed by using the same process used for the electrical paths 414-416 and 420-422 in the second direction. That is to say, during the formation of the electrical paths 414-416 and 420-422 in the second direction, the metal bumps 811-819 are also simultaneously formed.

In summary, the layouts of the above-mentioned embodiments can selectively decide to dispose openings in the insulation layer 310, which selectively enables the first conductive wires and the second conductive wires in different directions to be electrically connected with each other. The layout of the present invention can avoid the printed path from turning its path, so that the unstable pattern problem caused by the conventional inkjet printing or other processes at turning regions may be solved and the complexity of paths may be simplified, which realizes the mass production of printing products (for example, FCB or flexible device). In addition, prior to a inkjet printing process, the embodiments of the present invention allow the use non-inkjet printing for disposing the electrical paths in the first direction and the electrical paths in the second direction respectively in the first direction space and the second direction space of the above-mentioned devices. Since the connections in the partial array are implemented by using a process with a lower resistance (lower than the inkjet printing), and therefore a long inkjet printed path may be avoided (i.e., an excessive resistance of a path is avoided), the probabilities of broken line or ink-lacking events are reduced and the reliability of the product is promoted.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An intra-connection layout of array, comprising:
   a device array comprising a plurality of devices, disposed on a substrate; and
   at least an alterable area, disposed on the substrate and between the devices, comprising:
      a plurality of first conductive wires, disposed over the substrate and within the alterable area along a first direction selectively connecting electrical paths in the first direction between the devices;
      a plurality of second conductive wires, disposed within the alterable area along a second direction and located between the first conductive wires and the substrate selectively connecting electrical paths in the second direction between the devices, wherein the first conductive wires and the second conductive wires are straight wires; and
      an insulation layer, disposed within the alterable area and between the first conductive wires and the second conductive wires, wherein when one of the first conductive wires and one of the second conductive wires are electrically connected to each other, the insulation layer comprising an opening at a corresponding position so as to electrically connect the one of the first conductive wires with the one of the second conductive wires.

2. The intra-connection layout of array according to claim 1, wherein the device array comprises a transistor array.

3. The intra-connection layout of array according to claim 1, wherein the first conductive wires and the second conductive wires are formed by using a printing process.

4. The intra-connection layout of array according to claim 1, wherein the electrical paths in the first direction and the electrical paths in the second direction between the devices are formed by using an inkjet printing.

5. The intra-connection layout of array according to claim 1, wherein the electrical paths in the first direction and the electrical paths in the second direction between the devices are formed by using a screen printing.

6. The intra-connection layout of array according to claim 1, wherein the electrical paths in the first direction and the electrical paths in the second direction between the devices and intra-connections of the devices are formed by using an inkjet printing or a screen printing.

7. The intra-connection layout of array according to claim 1, wherein the insulation layer is formed by using inkjet printing.

8. The intra-connection layout of array according to claim 1, wherein the insulation layer is formed by using screen printing.

9. The intra-connection layout of array according to claim 1, further comprising a plurality of metal bumps disposed within the alterable area and at intersections of the first conductive wires and the second conductive wires and located between the second conductive wires and the substrate.

10. The intra-connection layout of array according to claim 3, wherein the printing comprises screen printing.

11. An intra-connection layout of array, comprising:
a device array, having a plurality of devices;
a plurality of electrical paths in a first direction, disposed in a first direction space between the devices along the first direction;
a plurality of electrical paths in the second direction, disposed in a second direction space between the devices along the second direction; and
at least an alterable area, disposed between the devices, comprising:
a plurality of first conductive wires, disposed within the alterable area along the first direction for respectively connecting the electrical paths in the first direction;
a plurality of second conductive wires, disposed within the alterable area along the second direction for respectively connecting the electrical paths in the second direction, wherein the first conductive wires and the second conductive wires are straight wires; and
an insulation layer, disposed within the alterable area and between the first conductive wires and the second conductive wires, wherein when one of the first conductive wires and one of the second conductive wires are electrically connected to each other, the insulation layer comprises an opening at a corresponding position so as to electrically connect the one of the first conductive wires with the one of the second conductive wires.

12. The intra-connection layout of array according to claim 11, wherein the conductive wires between the devices and the electrical paths in the first direction and the conductive wires between the devices and the electrical paths in the second direction are formed by using printing.

13. The intra-connection layout of array according to claim 11, wherein the device array comprises a transistor array.

14. The intra-connection layout of array according to claim 11, wherein the electrical paths in a first direction and the electrical paths in the second direction are formed by using a non-inkjet-printing process.

15. The intra-connection layout of array according to claim 14, wherein the electrical paths in the first direction and the electrical paths in the second direction are formed by using screen printing.

16. The intra-connection layout of array according to claim 11, wherein the electrical paths in the first direction and the electrical paths in the second direction between the devices and are intra-connections of the devices are formed by using an inkjet printing or a screen printing.

17. The intra-connection layout of array according to claim 11, wherein the first conductive wires and the second conductive wires are formed by using a printing process.

18. The intra-connection layout of array according to claim 17, wherein the first conductive wires and the second conductive wires are formed by using screen printing.

19. The intra-connection layout of array according to claim 17, wherein the first conductive wires and the second conductive wires are formed by using inkjet printing.

20. The intra-connection layout of array according to claim 11, wherein the insulation layer is formed by using inkjet printing.

21. The intra-connection layout of array according to claim 11, wherein the insulation layer is formed by using screen printing.

22. The intra-connection layout of array according to claim 11, further comprising a plurality of metal bumps disposed within the alterable area and at intersections of the first conductive wires and the second conductive wires and located between the second conductive wires and a substrate.

* * * * *